(12) United States Patent
Koyama

(10) Patent No.: US 9,553,211 B2
(45) Date of Patent: Jan. 24, 2017

(54) SCHOTTKY BARRIER DIODE AND APPARATUS USING THE SAME

(71) Applicant: CANON KABUSHIKI KAISHA, Tokyo (JP)

(72) Inventor: Yasushi Koyama, Kamakura (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 144 days.

(21) Appl. No.: 13/925,071

(22) Filed: Jun. 24, 2013

(65) Prior Publication Data
US 2014/0001363 A1    Jan. 2, 2014

(30) Foreign Application Priority Data
Jun. 27, 2012  (JP) .................. 2012-144320

(51) Int. Cl.
| | | |
|---|---|---|
| G01J 5/20 | (2006.01) | |
| H01L 29/872 | (2006.01) | |
| H01L 29/66 | (2006.01) | |
| H01L 31/108 | (2006.01) | |
| H01L 23/66 | (2006.01) | |
| H01L 29/06 | (2006.01) | |

(Continued)

(52) U.S. Cl.
CPC ............ *H01L 29/872* (2013.01); *H01L 23/66* (2013.01); *H01L 29/0649* (2013.01); *H01L 29/0657* (2013.01); *H01L 29/66143* (2013.01); *H01L 31/09* (2013.01); *H01L 31/108* (2013.01); *H01Q 1/2283* (2013.01); *H01L 29/0692* (2013.01); *H01L 2223/6677* (2013.01); *H01L 2924/0002* (2013.01)

(58) Field of Classification Search
CPC ............ H01L 29/872; H01L 29/66143; H01L 29/0619
See application file for complete search history.

(56) References Cited

U.S. PATENT DOCUMENTS

| | | | |
|---|---|---|---|
| 4,862,244 A * | 8/1989 | Yamagishi | ..................... 257/484 |
| 6,483,111 B1 * | 11/2002 | Ishikawa et al. | .......... 250/338.4 |
| 2007/0181909 A1 * | 8/2007 | Rozsypal | ..................... 257/109 |

FOREIGN PATENT DOCUMENTS

| | | |
|---|---|---|
| JP | S57-115875 A | 7/1982 |
| JP | S58-077256 A | 5/1983 |
| JP | S59-155178 A | 9/1984 |

(Continued)

OTHER PUBLICATIONS

Translation of Japanese Application Publication No. 09-162424 to Onoe et al.*

*Primary Examiner* — David J Makiya
*Assistant Examiner* — Kenneth J Malkowski
(74) *Attorney, Agent, or Firm* — Canon USA, Inc. IP Division

(57) ABSTRACT

A Schottky barrier diode includes a first semiconductor layer, a LOCOS layer arranged in contact with the first semiconductor layer, a Schottky junction region provided on a contact surface between the first semiconductor layer and a first electrode, a second semiconductor layer connected to the first semiconductor layer and having a higher carrier concentration than that of the first semiconductor layer, and a second electrode forming an ohmic contact with the second semiconductor layer. In this case, the Schottky junction region and the LOCOS layer are in contact.

22 Claims, 8 Drawing Sheets

(51) Int. Cl.
*H01Q 1/22* (2006.01)
*H01L 31/09* (2006.01)

(56) References Cited

FOREIGN PATENT DOCUMENTS

| | | |
|---|---|---|
| JP | 60-18959 A | 1/1985 |
| JP | 7-226386 A | 8/1995 |
| JP | 9-162424 A | 6/1997 |
| JP | 2002-57350 A | 2/2002 |
| JP | 2003-224244 A | 8/2003 |
| JP | 2010-062533 A | 3/2010 |

\* cited by examiner

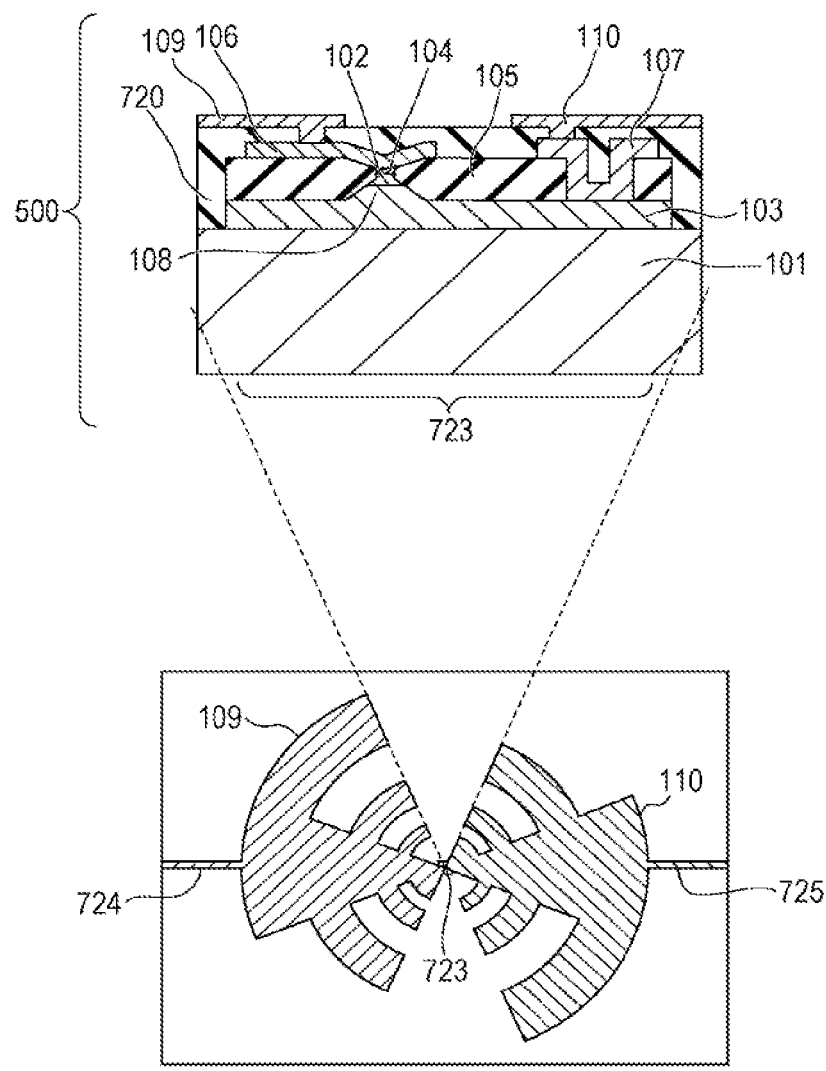

SCHOTTKY BARRIER DIODE AND APPARATUS USING THE SAME

BACKGROUND

Technical Field

Aspects of the present invention relate to Schottky barrier diodes and particularly relate to a Schottky barrier diode which oscillates or detects an electromagnetic wave in a frequency band within a frequency region from a millimeter-wave band to a terahertz band (equal to or higher than 30 GHz and equal to or lower than 30 THz) (hereinafter, called a terahertz-wave) and an apparatus using the same.

Description of the Related Art

A frequency region of terahertz-waves has an absorption peak derived from the structure and/or state of a biological material, pharmaceutical, electronic material, and many other organic molecules. Terahertz-waves are highly transmissive to materials such as paper, ceramics, resins, cloth. In recent years, imaging technologies and sensing technologies making use of such characteristics of terahertz-waves have been studied and developed. For example, their applications to safe fluoroscopic apparatuses alternative to X-ray apparatuses and in-line nondestructive inspection apparatuses in manufacturing processes are being expected.

Well known terahertz-wave detecting devices may include thermal detectors and quantum detectors. Examples of such a thermal detector may include a $VO_x$ microbolometer, TGS (Triglycine Sulphate) pyroelectric element, and a Golay cell using thermal expansion of gas. A thermal detector converts energy of an electromagnetic wave to heat and captures a change in heat electromotive force or resistance of a material due to a change in temperature to detect an electromagnetic wave. These devices may not necessarily be cooled but are slower to respond because of use of heat exchange. Examples of such a quantum detector may include an intrinsic semiconductor device (such as an MCT (HgCdTe) and a photoconductor) and a QWIP (Quantum Well Infrared Photodetector). A quantum detector captures an electromagnetic wave as a photon to detect a photovoltaic or resistance change in a semiconductor having a small band gap. Such a device is faster to respond but requires cooling because thermal energy at room temperature in the frequency region above is significant.

A terahertz-wave detecting device using a Schottky barrier diode has been developed which is faster to respond and does not require cooling. This detecting device captures an electromagnetic wave as a high frequency electric signal and rectifies with a diode the high frequency electric signal received through an antenna for detection. For example, Japanese Patent Laid-Open No. 09-162424 discloses a detecting device using a vertical Schottky barrier diode having two electrodes in a longitudinal direction on a substrate. The detecting device detects an approximately 28 THz electromagnetic wave (having a wavelength of 10.6 μm) from $CO_2$ laser. Japanese Patent Laid-Open No. 60-18959 discloses a rectifier using a horizontal Schottky barrier diode having tow electrodes on a surface of a substrate. The rectifier includes a Schottky electrode having a guard ring at its edge to increase its reverse bias resistance. US Patent Application Publication No. 2007/0181909 discloses a Schottky barrier diode which detects a microwave and has a Schottky barrier having a silicon oxide at its edge to increase its reverse bias.

However, since a vertical Schottky barrier diode as disclosed in Japanese Patent Laid-Open No. 09-162424 uses its substrate as an earth electrode, limited types of antenna may be integrally formed. In such a horizontal device in the past as disclosed in Japanese Patent Laid-Open No. 60-18959, a semiconductor interface exposes to an element structure between two electrodes or in the vicinity of a diode on a semiconductor surface, larger leak current is generated by formation of a parasitic current path and/or larger noise may occur due to a state of the interface.

In a structure (FIG. 9) disclosed in US Patent Application Publication No. 2007/0181909, noise may occur due to lack of an interface between a semiconductor 901 and a silicon oxide 900. The disclosed device may detect microwaves at partial frequency bands, but its application to highly sensitive detection of terahertz-waves has been difficult.

SUMMARY

According to an aspect of the present invention, a Schottky barrier diode includes a first semiconductor layer, a LOCOS layer arranged in contact with the first semiconductor layer, a Schottky junction region provided on a contact surface between the first semiconductor layer and a first electrode, a second semiconductor layer connected to the first semiconductor layer and having a higher carrier concentration than that of the first semiconductor layer, and a second electrode forming an ohmic contact with the second semiconductor layer. In this case, the Schottky junction region and the LOCOS layer are in contact.

In a Schottky barrier diode according to an aspect of the present invention, a LOCOS layer and a first semiconductor layer and/or a Schottky junction region are arranged in contact. This may prevent exposure of a semiconductor surface and/or interface and reduce its defect density in the vicinity of the Schottky junction region. Therefore, reduction of noise (such as 1/f noise or RTS noise) involved in carrier capture and/or emission may be expected. For that reason, a Schottky barrier diode according to an aspect of the present invention is more highly sensitive, compared with those in the past.

Further features of the present invention will become apparent from the following description of exemplary embodiments with reference to the attached drawings.

BRIEF DESCRIPTION OF THE DRAWINGS

FIGS. 6A and 6B illustrate a detecting device in one embodiment of the present invention.

DESCRIPTION OF THE EMBODIMENTS

Embodiments or examples of the present invention will be described below with reference to drawings.

First Embodiment

Figure 1A:
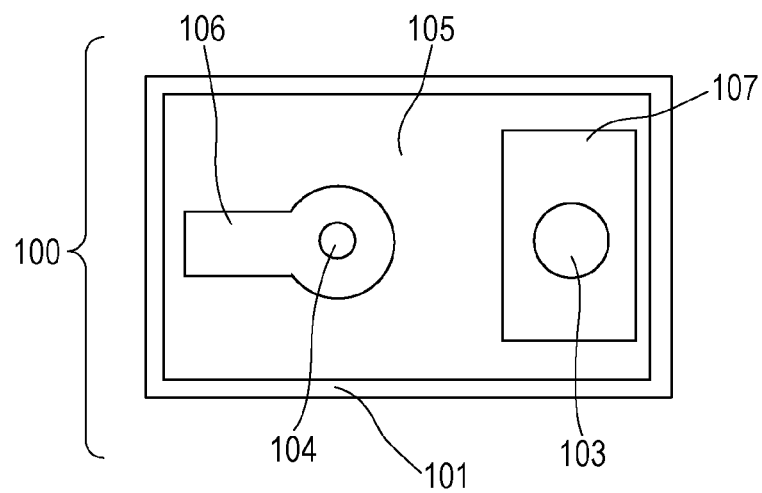
FIGS. 1A and 1B illustrate a diode in one embodiment of the present invention.
Figure 1B:
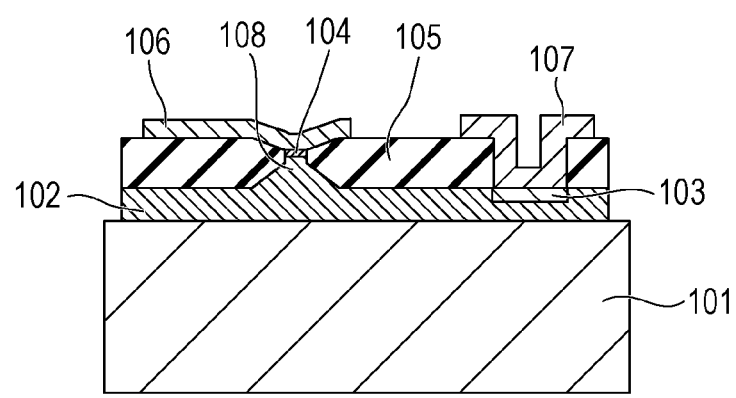
Figure 2:
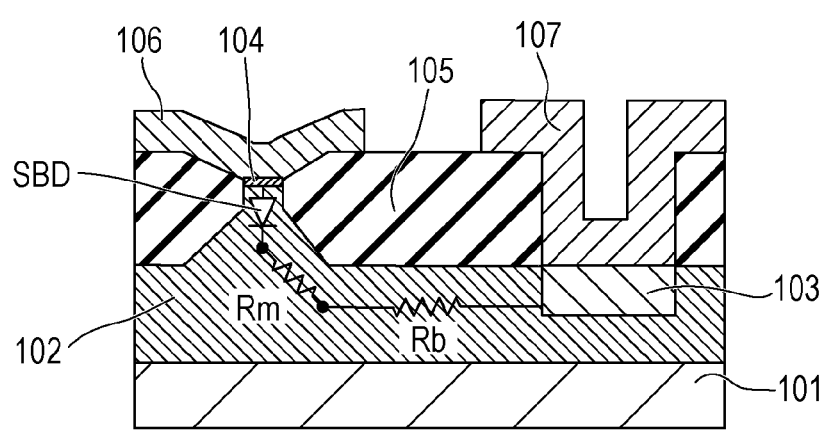
FIG. 2 illustrates a correspondence between a configuration of a diode in one embodiment of the present invention and a configuration of an equivalent circuit element.

A Schottky barrier diode according to a first embodiment will be described with reference to FIGS. 1A and 1B and FIG. 2. As illustrated in FIGS. 1A and 1B and FIG. 2, a Schottky barrier diode 100 of this embodiment includes a substrate 101, a first semiconductor layer 102 formed thereon, a second semiconductor layer 103 having a higher carrier concentration than the first semiconductor layer 102, and a LOCOS layer 105. The Schottky barrier diode 100 further includes a first electrode 106 (hereinafter, called a Schottky electrode) Schottky-connected to a part of the first semiconductor layer 102 and a second electrode (hereinafter, called an ohmic electrode) 107 which forms an ohmic contact with the second semiconductor layer 103.

An interface where the first semiconductor layer 102 and the Schottky electrode 106 are in contact has a Schottky junction region 104. The Schottky junction region may sometimes refer to an interface only or may refer to an area having a predetermined thickness from an interface or an area including an interface having a predetermined thickness. In order to provide the Schottky junction region 104 in an interface in contact with the Schottky electrode 106, the first semiconductor layer 102 typically has an area having an order of $10^{15}$ to $10^{17}$ cm$^{-3}$ charge carriers in the vicinity of a contact surface with the Schottky electrode 106. The first semiconductor layer 102 and the second semiconductor layer 103 are in contact with each other and are mechanically and electrically coupled. The second semiconductor layer 103 is a structure allowing the first semiconductor layer 102 and the ohmic electrode 107 to be coupled for lower ohmic resistance. According to this embodiment, the second semiconductor layer 103 has a higher carrier concentration achieved by doping impurities to a part of a semiconductor in the first semiconductor layer.

The LOCOS layer 105 is a silicon oxide film formed by a LOCOS (Local Oxidation of Silicon) method. According to this embodiment, a silicon layer including the first semiconductor layer 102 is locally thermally oxidized with a pattern layer containing $Si_3N_4$ having a slightly larger area than the Schottky junction region 104 as a mask to form a mesa structure 108 that is a part of the LOCOS layer 105 and first semiconductor layer 104. The LOCOS layer 105 surrounds the Schottky junction region 104 and mesa structure 108. The LOCOS layer 105, Schottky junction region 104, mesa structure 108 and first semiconductor layer 102 are in contact with each other.

Here, the size of a pattern containing $Si_3N_4$ which functions as a mask for a LOCOS process and determines the area of the Schottky junction region 104 may be designed from a general thermal oxidation theory as proposed by Deal-Grove. That is, briefly, a pattern extending to both sides by approximately 0.5 times of the thickness of the LOCOS layer 105 to be formed is used for a desirable pattern dimension. For example, in order to acquire a 0.5 μm thick LOCOS layer 105 and a 0.5 μm diameter Schottky junction region 104, thermal oxidation may be performed with an approximately 1 μm pattern containing $Si_3N_4$ as a mask. In reality, the rate and/or result of oxidization may slightly change in accordance with a condition for the thermal oxidation and/or a configuration of a surrounding film. However, controlling a film deposition condition properly by setting the conditions several times allows as highly precise as an nm order of design and/or production of the size of Schottky junction region 104 and the structure of the mesa structure 108. Here, though the area of the Schottky junction region 104 depends on the type and/or characteristic of a semiconductor used therein, it may be set in a range of 0.1 μm$^2$ to 10 μm$^2$ to raise the cutoff frequency from millimeter waves to a terahertz band.

The Schottky electrode 106 is a layer in contact with the first semiconductor layer 102 and contains a metal material which forms the Schottky junction region 104. The Schottky electrode 106 is in contact with the LOCOS layer 105 and is arranged so as to cover at least a part of the LOCOS layer 105. According to this embodiment, the Schottky electrode 106 is arranged so as to cover the entire surface of the Schottky junction region 104 and a partial surface of the LOCOS layer 105. The term "cover" here refers to a structure in which the Schottky electrode 106 arranged on a surface of the Schottky junction region 104 is also partially superposed on the LOCOS layer 105 arranged in contact with a circumference of the Schottky junction region 104.

The ohmic electrode 107 is a layer containing a metal material in ohmic-contact with the second semiconductor layer 103. The ohmic electrode 107 is in contact with the LOCOS layer 105 and is arranged so as to cover at least a part of the LOCOS layer 105. According to this embodiment, the ohmic electrode 107 is arranged so as to cover the entire exposed surface of the second semiconductor layer 103 and a partial surface of the LOCOS layer 105. The term "cover" here refers to a structure in which the ohmic electrode 107 arranged on an exposed surface of the second semiconductor layer 103 is partially superposed on the LOCOS layer 104 arranged in contact with a circumference of an exposed surface of the second semiconductor layer 103.

Configuring as described above provides the Schottky barrier diode 100 in which the Schottky electrode 106, Schottky junction region 104, first semiconductor layer 102, second semiconductor layer 103, and ohmic electrode 107 are electrically coupled in order. The Schottky barrier diode 100 has a horizontal configuration including the two electrodes 106 and 107 on one same semiconductor surface (that is, a surface of the substrate 101 including the semiconductor layers 102 and 103 and the LOCOS layer 105).

In the horizontal Schottky barrier diode 100 disclosed in the present invention, the LOCOS layer 105 is arranged between two electrodes of the Schottky electrode 106 and ohmic electrode 107 on its surface so that a semiconductor surface between the two electrodes may not be exposed. Thus, current input to the Schottky electrode 106 is injected to the mesa structure 108 through the Schottky junction region 104 by avoiding the area including the LOCOS layer 105 that is an insulator and the substrate 101. After that, the current passes through the first semiconductor layer 102 region between the LOCOS layer 105 and the substrate 101, is injected to the second semiconductor layer 103 having a high carrier concentration and is output to the ohmic electrode 107. In this manner, current form the Schottky electrode 106 dominantly flows through an electric circuit including the Schottky diode (SBD), a resistance (Rm) of the mesa structure 108, a resistance (Rb) of the first semiconductor layer 102 under the LOCOS layer 105, as illustrated in FIG. 2. As a result, this configuration of the present invention allows parasitic leak current flowing through a semiconductor interface exposed between two electrodes in a horizontal Schottky barrier diode, which has been a problem in the past, to bypass the interface, and the leak current may significantly be inhibited.

Generally, an outermost surface of a semiconductor has many surface levels due to incomplete bonding because of crystal discontinuity and/or impurities adhered to the surface. The surface levels may be formed due to an interface between a semiconductor and air or other materials a defect or impurities formed on a semiconductor surface during a manufacturing process, for example. It has been well known that the surface levels cause noise such as 1/f noise and RTS noise due to a what-is-called carrier capture or emission process. Therefore, configurations in the past have a problem that noise occurs in a diode due to a semiconductor interface exposed between two electrodes on a surface, a semiconductor interface exposed to a side of a mesa structure formed by etching, or a damage layer due to a process, for example.

In the Schottky barrier diode 100 of the present invention, the LOCOS layer 105 are arranged in contact with the first semiconductor layer 102 and Schottky junction region 104. This may eliminate the semiconductor surface exposed between two electrodes, which may reduce noise occurring in the Schottky barrier diode 100. An interface between silicon and silicon thermal oxide has been well known as having a lower defect density than an interface between silicon and a silicon oxide layer formed thereon by a sol-gel method. Thus, a configuration of the present invention has a low defect density Si/SiO$_2$ interface formed between the first semiconductor 102 and the LOCOS layer 105 in the vicinity of the Schottky junction region 104 and mesa structure 108. Therefore, noise due to surface levels and/or defects may be reduced. The mesa structure 108 is configured by actively using a local distortion caused by silicon thermal oxide according to the present invention. Thus, the mobility of electrons in a semiconductor may be controlled to adjust its cutoff frequency.

Figure 3A:
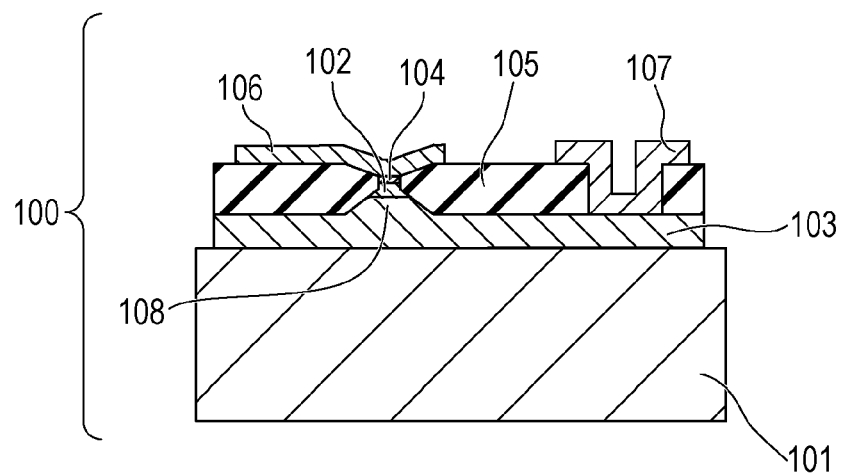
FIGS. 3A and 3B illustrate variation examples of a diode.
Figure 3B:
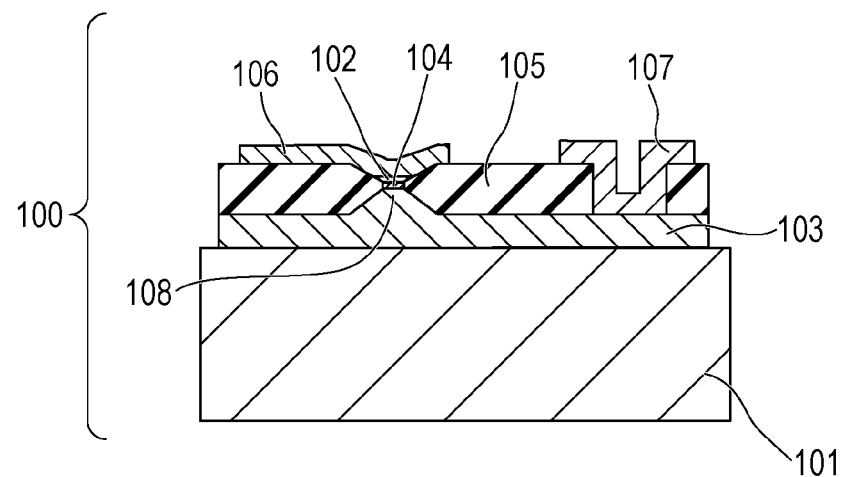

FIGS. 3A and 3B illustrate variation examples of this embodiment. The Schottky barrier diode 100 illustrated in FIG. 3A has on the substrate 101 the second semiconductor layer 103 having a higher carrier concentration and the first semiconductor 102 having a lower carrier concentration in this order. The LOCOS layer 105 is formed by local thermal oxidation of a silicon layer including the first semiconductor layer 102 and the second semiconductor layer 103. The LOCOS layer 105 is oxidized to a sufficient thickness to reach at least the second semiconductor layer 105. The first semiconductor layer 102 is doped so as to typically have an order of $10^{15}$ to $10^{17}$ cm$^{-3}$ charge carriers so that the Schottky junction region 104 may be formed on an interface in contact with the Schottky electrode 106. The second semiconductor layer 103 is doped typically to an order of $10^{18}$ cm$^{-3}$ or more charge carriers so that it may be coupled with the ohmic electrode 107 by ohmic contact. The configuration except for the part is the same as the example above. This configuration may lower the resistances (corresponding to Rm and Rb in FIG. 2) of the mesa structure 108 and the second semiconductor layer 103 under the LOCOS layer 105, which is effective for detection of a high frequency of the Schottky barrier diode 100, particularly, detection of a terahertz-wave.

The Schottky barrier diode 100 illustrated in FIG. 3B has on the substrate 101 the second semiconductor layer 103 having a higher carrier concentration and the first semiconductor 102 having a lower carrier concentration connected to the second semiconductor layer 103. The LOCOS layer 105 is formed by local thermal oxidation on a semiconductor including the second semiconductor layer 103. The first semiconductor layer 102 includes a semiconductor formed by selective epitaxial growth with a LOCOS layer as a mask on a surface of the exposed second semiconductor layer 103 surrounded by the LOCOS layer 105. A contact surface of the first semiconductor layer 102 and Schottky electrode 106 has the Schottky junction region 104. The first semiconductor layer 102 includes a semiconductor layer doped so as to typically have an order of $10^{15}$ to $10^{17}$ cm$^{-3}$ charge carriers in the vicinity of a contact interface with the Schottky electrode 106. The second semiconductor layer 103 is doped so as to typically have an order to $10^{19}$ cm$^{-3}$ or more charge carriers, like the example in FIG. 3A and is coupled to the ohmic electrode 107 by ohmic contact. The configuration except for this part is the same as the one in FIG. 3A. This configuration allows arbitrary selection of a semiconductor material having different band gap, lattice constant, mobility, dopant concentration and so on for the first semiconductor layer 102, as will be described below, which is effective for achieving a high frequency and/or highly sensitive Schottky barrier diode 100.

Figure 4A:
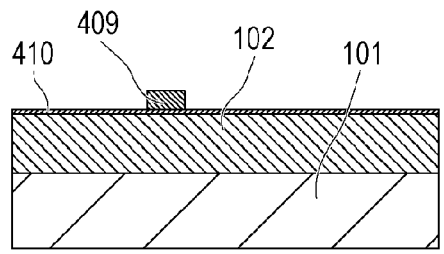
FIGS. 4A to 4F illustrate a manufacturing method for a diode in one embodiment of the present invention.

The Schottky barrier diode 100 according to the present invention may be produced by a manufacturing method including at least the following steps (A) to (E) as illustrated in FIG. 4:

(A) forming a pattern layer 409 containing Si$_3$N$_4$ through a pad oxide film 410 on a top surface of the semiconductor layer 102 on the substrate 101 (FIG. 4A);

(B) thermally oxidizing the semiconductor layer 102 by a thermal oxidation method and forming the mesa structure 108 under the pattern layer 409 and the LOCOS layer 105 around the pattern layer 409.

Figure 4D:
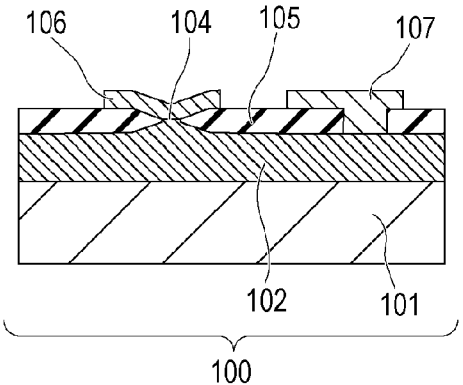
Figure 4B:
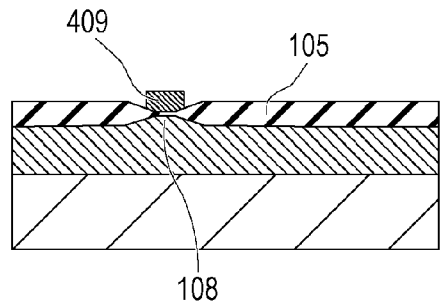
Figure 4E:
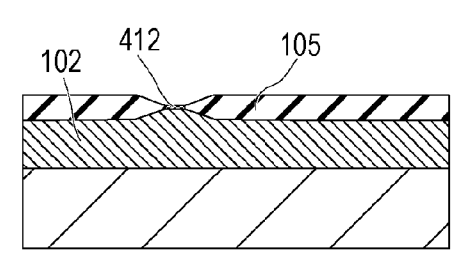
Figure 4C:
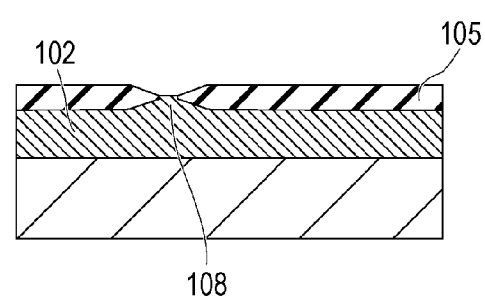

(C) removing the pattern layer 409 to expose a surface of the semiconductor layer 102 (FIG. 4C);

(D) forming the Schottky electrode 106 in Schottky contact with the semiconductor layer 102 such that the Schottky electrode 106 may be in contact with the LOCOS layer 105 and overlaps with the LOCOS layer 105 (FIG. 4D); and (E) forming the ohmic electrode 107 in ohmic contact with a part of the semiconductor layer 102 (FIG. 4D). According to this manufacturing method, a metal film forming the Schottky electrode 106 is formed over the LOCOS layer 105 such that the minute Schottky junction region 104 may be formed on the exposed part of the semiconductor layer 102 with high accuracy. The area of the exposed part of the semiconductor layer 102 may be controlled by controlling a dimension of the pattern layer 409 containing Si$_3$N$_4$ as known in a LOCOS process in the past.

Through those steps above, the exposed part of the semiconductor layer 102 (or the uppermost surface of the mesa structure 108) and the accuracy of alignment with the Schottky electrode 106 do not depend on the area of the Schottky junction region 104. Therefore, the structure may be formed on the Schottky junction region having a minute area of 1 μm$^2$ or smaller with high accuracy and high yield, contributing to lower capacitance due to a reduced area of the Schottky joint region. The Schottky electrode 106 and the ohmic electrode 107 are allowed to be integrally formed more closely to the diodes and more closely to each other, which may inhibit parasitic series resistance (corresponding to Rs). Thus, a Schottky barrier diode produced by the manufacturing method has a reduced RC delay and therefore is expected to operate highly sensitively to terahertz-waves having a higher frequency than those in the past. In addition, because high accuracy of alignment is not necessary, an improvement of productivity due to an improved yield and reduced number of steps may be expected.

Figure 4F:
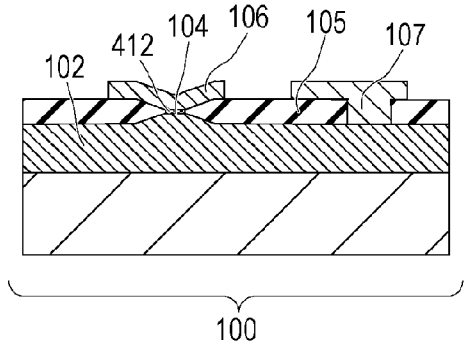

A Schottky barrier diode, like the Schottky barrier diode 100, of the present invention may be produced by a manufacturing method including a step (F) after the step (C) and including a step (G) instead of the step (D) as follows:

(F) forming the semiconductor layer 412 by selective epitaxial growth on the exposed surface of the semiconductor layer 102 surrounded by the LOCOS layer 105 (FIG. 4E), where the semiconductor layer 412 may contain a layer having a lower carrier concentration than the semiconductor layer 102, and the LOCOS layer 105 functions as a mask for the selective epitaxial growth; and (G) forming the Schottky electrode 106 in Schottky contact with a surface of the semiconductor layer 412 such that it may be in contact with the LOCOS layer 105 and overlap with the LOCOS layer 105 (FIG. 4F).

This manufacturing method may apply a technology of forming the semiconductor layer 412 by selective epitaxial growth only on an exposed surface of the semiconductor layer 102 surrounded by the LOCOS layer 105 with the LOCOS layer 105 as a mask. Thus, for the semiconductor layer 412, Si having a different characteristic such as a carrier concentration and/or a semiconductor material such as SiGe, GaAs, InGaAs, and AlAs, excluding Si may be selected, from which a highly sensitive and high frequency Schottky diode may be expected.

According to this embodiment, carriers may be selected arbitrarily. However, selection of electrons with high mobility may reduce its delay time and increase its cutoff frequency. Furthermore, its mobility depends on a material of a semiconductor. For example, when an Si-based material is used as the semiconductor, a common Si process including a LOCOS method is applicable thereto. Thus, the structure of the present invention may be produced more easily. In addition, it allows amplifiers such as a MOSFET in CMOS and an HBT in BiCMOS to be integrally formed on one substrate. On the other hand, use of a selective epitaxial growth technology or an ELT (Epitaxial Layer Transfer) technology allows selection of a SiGe-based, GaAs-based, InP-based (containing InGaAs), InAs-based, or InSb-based semiconductor. Selecting a material with carriers having high mobility for the second semiconductor 102 may raise its cutoff frequency.

According to the present invention, a highly sensitive Schottky barrier diode may be provided in which a leak current fed to an exposed semiconductor interface may be inhibited and noise occurring when carriers are trapped by the interface may be reduced. Furthermore, according to the present invention, a high frequency Schottky barrier diode with an RC delay inhibited may be provided. Still further, a Schottky barrier diode of the present invention may be used to provide an electromagnetic wave detecting device that is high sensitive to a high frequency region from a millimeter-wave band to a terahertz band (30 GHz or higher and 30 THz or lower) and an apparatus using it.

Second Embodiment

Figure 5A:
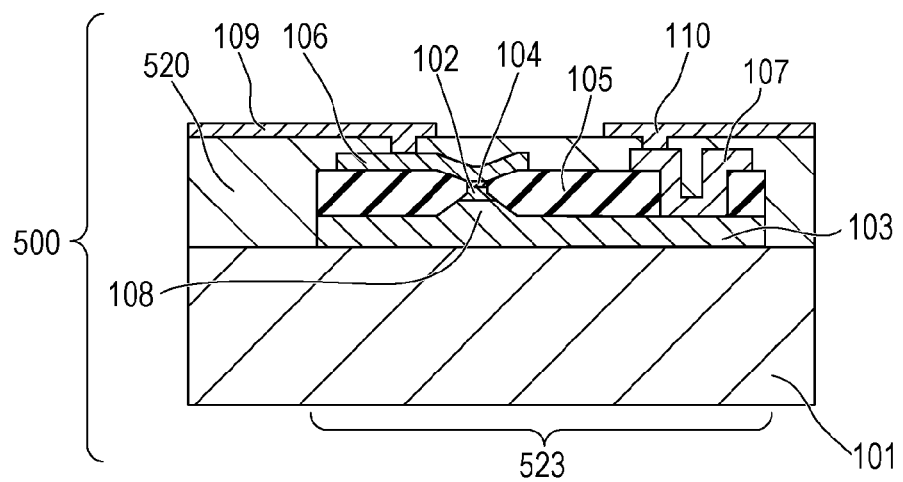
FIGS. 5A and 5B illustrate a detecting device in one embodiment of the present invention.
Figure 5B:
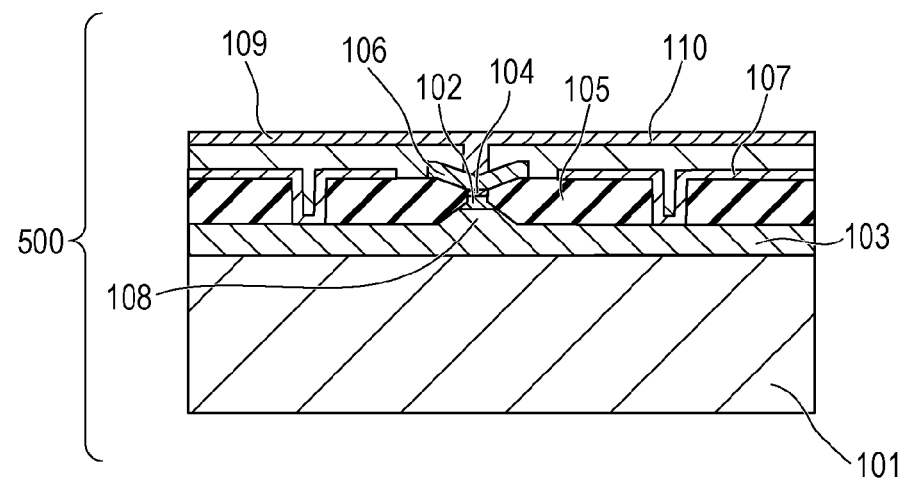

A detecting device 500 according to a second embodiment will be described with reference to FIGS. 5A and 5B. This embodiment is a variation example of the first embodiment. This embodiment illustrated in FIG. 5A is different from the first embodiment in that the semiconductor layers 102 and 103 are separated by the substrate 101 and a dielectric substance 520 in an island-shape. In other words, the Schottky electrode 106 and ohmic electrode 107 and the first semiconductor layer 102 and second semiconductor layer 103 are arranged to have island shapes on the semiconductor substrate 101. Antennas 109 and 110 that are conductive layers are connected to the Schottky electrode 106 and ohmic electrode 107, respectively. The other configuration is the same as the first embodiment, and the LOCOS layer 105 that is a characteristic of the present invention is in contact with a circumference of the Schottky junction region 104.

According to this embodiment, a detecting device has one diode formed in an island shape. When such an island 523 is sufficiently smaller than a wavelength of an electromagnetic wave to be detected, it may be approximate as a lumped constant element. The island 523 may be produced in approximately several μm and may function as a detecting device for a range from a millimeter-wave band to a terahertz band. Thus, the entire region excluding the sufficiently small semiconductor layers 102 and 103, electrodes 106 and 107, Schottky junction region 104, and LOCOS layer 105 is a dielectric substance containing air, and its field (electric field) is easily controllable through the antennas 109 and 110. For example, the antennas 109 and 110 to be integrally formed may be a resonant dipole antenna or a slot antenna or a wide-band log-periodic antenna. Many types of balanced antenna are available and may be used as a detecting device. A transmission line may be provided in a part of the antennas 109 and 110. Alternatively, an existing microwave technology may be used such as impedance matching between a diode and an antenna.

The substrate 101 may behave as a dielectric substance at a frequency band to be detected and have a low free carrier absorption and may be a semi-insulating GaAs or InP substrate or an FZ-Si substrate having a higher resistivity. For a 1 THz or higher frequency region, a CZ (MCZ)—Si substrate having a resistivity of 20 Ωcm or higher may be used. The dielectric substance 520 has a low dielectric loss in a frequency band to be detected and may be an oxide film of SiO or a nitride film of SiN. For a terahertz band, a resin of BCB (Benzocyclobutene) may be used.

Apparently, an unbalanced antenna may be integrally formed thereto. FIG. 5B illustrates a variation example of this embodiment. The ohmic electrode 107 is used as an earth conductor pattern, instead of use of an earth electrode as a substrate as in Japanese Patent Laid-Open No. 09-162424. In this case, the substrate 101 may have either high or low resistivity. In either case, the earth electrode includes the electrode 107 being an earth conductor pattern and the second semiconductor layer 103. The antenna 109 functioning as an upper electrode may be formed on the earth electrode to easily configure an unbalanced antenna. For example, a resonant patch antenna may be integrally formed.

More specific diodes and detecting devices will be described with reference to examples.

First Example

A specific detecting device 500 according to the second embodiment will be described with FIGS. 6A and 6B. According to this example, the detecting device has a Schottky barrier diode for an application of detecting an electromagnetic wave.

In this example, the substrate 101 is an Si substrate. Against growth by FZ method, a material of a high resistivity of 1 kΩcm is used. Electrons are used as carriers, an n-type carrier concentration of the first semiconductor layer 102 is $5 \times 10^{17}$ cm$^{-3}$, and its thickness is 100 nm. An n-type carrier concentration of the second semiconductor layer 103 is $5 \times 10^{19}$ cm$^{-3}$, and its thickness is 400 nm. The LOCOS layer 105 is a silicon oxide film acquired by thermal oxidation of a part of the semiconductor layers 102 and 103 by using a pattern containing $Si_3N_4$ as a mask, and its thickness is 500 nm. The LOCOS layer 105 surrounds the Schottky junction region 104 and mesa structure 108. The LOCOS layer 105 and the Schottky junction region 104, mesa structure 108, first semiconductor layer 102 and second semiconductor layer 103 are in contact with each other.

The ohmic electrode 107 is arranged immediately above the second semiconductor layer 103 having a higher n-type carrier concentration and is in ohmic contact with the second semiconductor layer 103. In this example, a 200-nm thick AlSi material is used as its electrode material. The Schottky electrode 106 is in contact with a surface of the first semiconductor layer 102 having a lower carrier concentration, and the interface has a Schottky junction region 104. In this example, a 200-nm thick Ti material is used as its electrode material. The materials and thicknesses of the Schottky electrode 106 and ohmic electrode 107 are not limited to those described above. A metallic material used for a general ohmic electrode and/or a Schottky electrode of a semiconductor to be used may be formed in an arbitrary thickness. Thus, a diode to which the present invention is applicable is configured.

In order to configure the detecting device 500 to which the present invention is applicable, an island 723 including the semiconductor layers 102 and 103, electrodes 106 and 107, Schottky junction region 104, and LOCOS layer 105 is formed. The size of the island may be approximately 50 $\mu m^2$ or smaller for detection of an electromagnetic wave in a frequency band of 0.5 THz or higher to 3 THz or lower. In this example, each side was designed to be approximately 7 $\mu m$ long. The island 723 is embedded in $SiO_2$ 720, and the Schottky electrode 106 and ohmic electrode 107 are coupled with the antennas 109 and 110 made of metal such as Ti/Al through contact holes. Note that a contact part between the Schottky electrode 106 and the first semiconductor layer 102, that is, the Schottky junction region 104 is designed to have a diameter of 0.6 $\mu m$, and the distance between the Schottky electrode 106 and the ohmic electrode 107 was designed to be 1 $\mu m$ such that the cutoff frequency of an RC low pass filter may be approximately 3 THz.

A log-periodic antenna illustrated in FIG. 6A is used as an example of an integrated antenna having two electrodes in a diode structure as output ports in this example. Each of the antennas 109 and 110 was designed such that a radius to an outer edge may be 250 $\mu m$, a radius to the innermost edge may be 10 $\mu m$, the number of combs of the log periodic antenna for a frequency range from 0.7 GHz may be 9, and the angles of the combs may be 45 degrees. Simulating this structure was simulated by using a high frequency entire electromagnetic simulator HFSS v1 2 (manufactured by Ansoft Corporation), it was found that an electromagnetic wave in a wide frequency band of 0.2 to 2.5 THz could be detected. In this way, there may be provided a detecting device including a Schottky barrier diode and antennas for inducing an electric-field component of a detected electromagnetic wave between the Schottky electrode 106 and the ohmic electrode 107, wherein the Schottky electrode 106 and the ohmic electrode 107 are output ports of the antennas.

Detection may include, reading of detected current with a current measuring unit, not illustrated, through lines 724 and 725 as shown in FIG. 6B, for example. In this case, a voltage applying unit, not illustrated, may apply a bias voltage to the read lines 724 and 725 to set an operating point voltage of the diode. A diode having a high sensitivity may be acquired by biasing approximately to 0 V in this example. An optimum bias voltage in this case depends on an electrode material of the Schottky electrode 106. For a structure in this example, the bias voltage may be approximately 0 V for an electrode material having a lower work function, such as Ti or may be a forward bias of a range of approximately 0.3 to 0.5 V for an electrode material having a higher work function, such as Pt or Pd.

The detecting device in this example is produced by a manufacturing method including steps (1) to (8) below. The manufacturing method will be described with reference to FIGS. 4A to 4F and FIGS. 6A and 6B.

(1) The semiconductor layers 102 and 103 which are epitaxially grown layers are integrated on the Si substrate 101. A CVD method, an MBE method or the like may be applicable to the crystal growth. After that, in order to protect the silicon surface, a 30-nm pad oxide film (corresponding to the film 410 in FIG. 4A) is formed by a thermal oxidation method. Then, a $Si_3N_4$ layer 100-nm thick is formed on the surface by an LPCVD (Low Pressure Chemical Vapor Deposition) method. Then, a resist pattern (not illustrated) is formed on a $Si_3N_4$ pattern formed region (corresponding to the pattern layer 409 in FIG. 4A) through a photolithography process using a stepper. The resist pattern is a circular pattern having a diameter of 1.1 $\mu m$ arranged at a position having a central axis matched with a central axis of the Schottky junction region 104 such that the diameter of the Schottky junction region 104 may be equal to 0.6 $\mu m$. Next, the resist pattern is used as a mask to remove the $Si_3N_4$ layer on the substrate by an ICP-RIE (Inductive Coupled Plasma Reactive Ion Etching) method using $CF_4$ (not illustrated). Then, the resist is removed by using ashing and sulfuric acid/hydrogen peroxide mixture (corresponding to FIG. 4A).

(2) The $Si_3N_4$ layer is used as a mask to form the LOCOS layer 105 of silicon thermal oxide having a thickness of 500 nm by pyrogenic thermal oxidation at 1100° C. with mixed gas of $H_2$ and $O_2$ (corresponding to FIG. 4B).

(3) The $Si_3N_4$ and pad oxide film are etched by an RIE (Reactive Ion Etching) method and immersion to buffered HF solution, for example, whereby a surface of the first semiconductor layer 102 is exposed (corresponding to FIG. 4C).

(4) A resist pattern is formed by lithography using a stepper to remove a region for forming the Schottky electrode 106. After that, electron beam evaporation is used to form a 200-nm thick Ti layer. Next, the Ti layer excluding the Schottky electrode 106 region is removed by a lift-off method using an organic solvent, and the Schottky electrode 106 is formed. Here, a lift-off is used in the electrode forming step in order to avoid occurrence of a defect due to a process damage by resurfacing on the first semiconductor layer 102 on which the Schottky junction region 104 is to be formed. Though a lift-off method by electron beam evaporation is used in this example, an embodiment of the present invention is not limited thereto. For example, sputtering or dry etching may be used for the formation.

(5) Contact holes for forming the electrode 107 are formed in a part of the LOCOS layer 105 by using lithography using a stepper and RIE. After that, a resist pattern is formed by lithography using a stepper to remove a region on which the ohmic electrode 107 is to be formed. Then, a 200-nm thick AlSi layer is formed by electron beam evaporation. Next, the AlSi layer excluding the region for the ohmic electrode 107 is removed by a lift-off method using an organic solvent to form the ohmic electrode 107 (corresponding to FIG. 4D). Though a lift-off method using electron beam evaporation is used in this example, an embodiment of the present invention is not limited thereto. For example, sputtering or dry etching may be used for the formation.

(6) Patterning by lithography using a stepper is performed such that a resist may remain in a region where the island 723 is to be formed. Then, the resist is used as a mask to etch a part of the LOCOS layer 105 by an RIE using mixed gas of $CF_4$ and $O_2$. Then, a silicon layer being the second semiconductor layer 103 is etched by an RIE using halogen-based gas such as $SF_6$ and $Cl_2$. In this case, etching to the substrate 101 is performed for electrical insulation from adjacent devices. The resist mask is removed by ashing and immersion to an organic solvent.

(7) An $SiO_x$ layer to be the insulating layer 720 is formed by a plasma CVD (Chemical Vapor Deposition) method. Here, when the island 723 of the substrate and concaves and convexes of the electrodes 106 and 107 are reflected onto the $SiO_x$ layer and when an influence may possibly occur such as a lack of a depth of focus for patterning a log-periodic antenna, which will be described below, the following step may be performed. That is, after an $SiO_x$ layer is buried, the $SiO_x$ layer may be flattened by a CMP (Chemical Mechanical Polishing) step.

(8) A resist is patterned to remove the $SiO_x$ layer on the electrodes 106 and 107, and through-hole etching is performed thereon. The RIE method using $CF_4$ above may be used for the etching. After the resist is removed, a 10-nm/200-nm thick Ti/Al film is formed by sputtering. After the film is formed, a resist is patterned to form the log-periodic antennas 109 and 110, and an unnecessary part of the Ti/Al film is etched by the RIE method or a combination of an ECR (electron cyclotron resonance) etching method with a high plasma density and halogen-based gas. After that, the resist is removed.

By performing the steps above, the detecting device 500 completes.

The device manufacturing method in this example may be a selective epitaxial growth technology, as illustrated in FIGS. 4E and 4F. In this case, after the step (3) (state in FIG. 4C), a step is performed in which a 10-nm Si layer or 10-nm SiGe layer with different doping levels epitaxially grows with the LOCOS layer 105 as a mask, for example, by selectively using an MBE method only for a surface of the first semiconductor layer 102. The other steps of this manufacturing process may be substantially same as (1) to (8) above. Performing the step above allows selection of Si or a semiconductor material excluding Si with different characteristics such as carrier concentrations and band gaps, achieving a further highly sensitive and high frequency detecting device.

Figure 7:
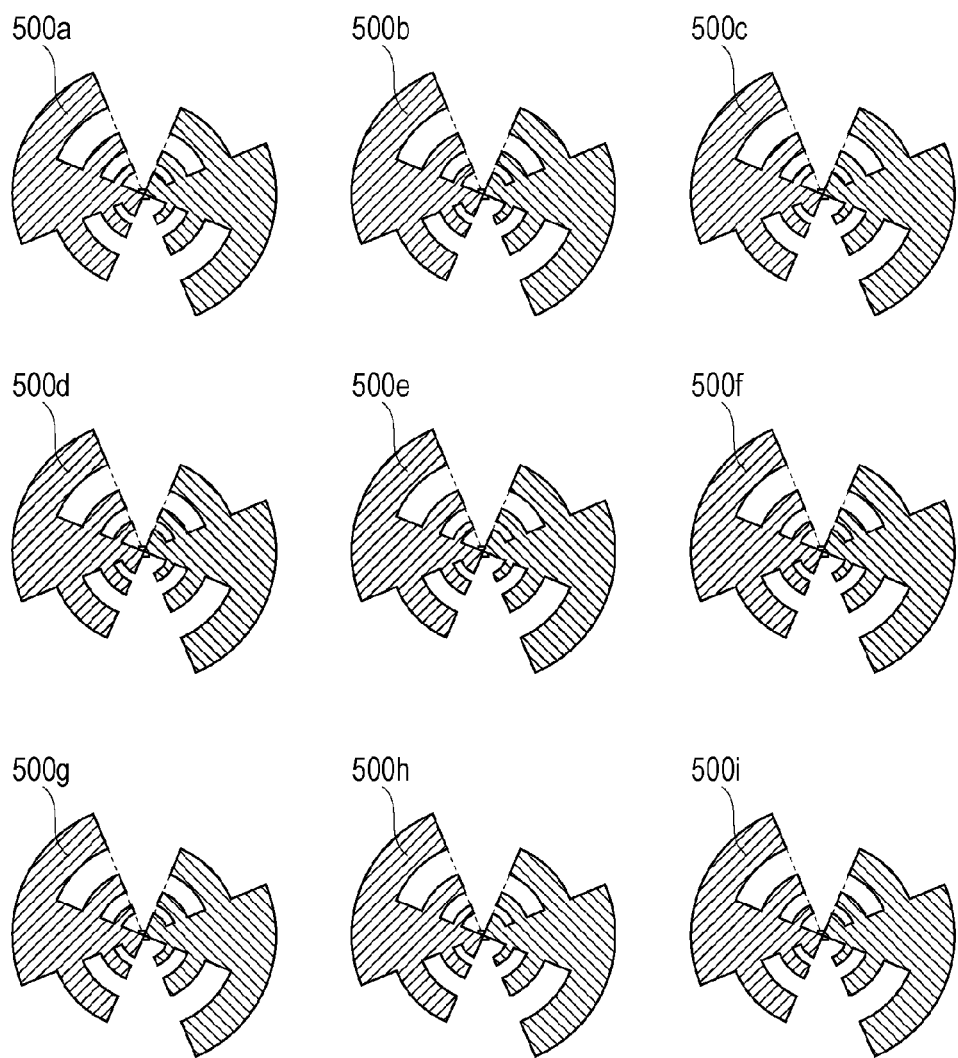
FIG. 7 illustrates an image forming apparatus having a detecting device in one embodiment of the present invention.

A plurality of arrays of the detecting device according to this example may be arranged to configure an image forming apparatus including an image forming unit which forms an image of an electric-field distribution on the basis of electric fields of electromagnetic waves detected by the plurality of detecting devices. For example, FIG. 7 discloses an example of an image forming apparatus having 3×3 focal plane arrays of the detecting devices 500 (500a to 500i) with 600 μm pitches. In this case, when the detecting devices are arranged with antennas in different directions, the image forming apparatus may support different polarized waves. When the detecting devices are arranged with resonant antennas for different frequencies, the image forming apparatus may support different frequencies.

Second Example

Figure 8:
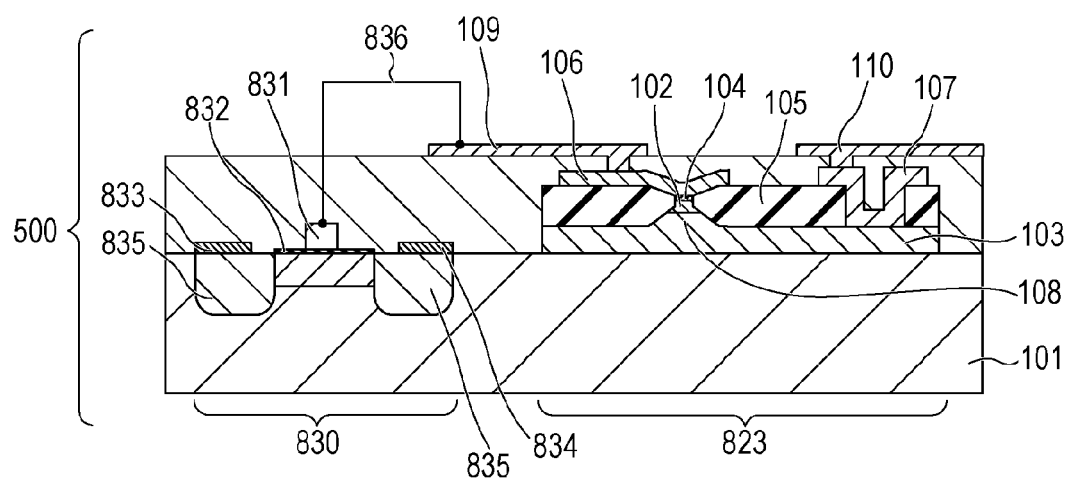
FIG. 8 illustrates a detecting device in one embodiment of the present invention.
Figure 9:
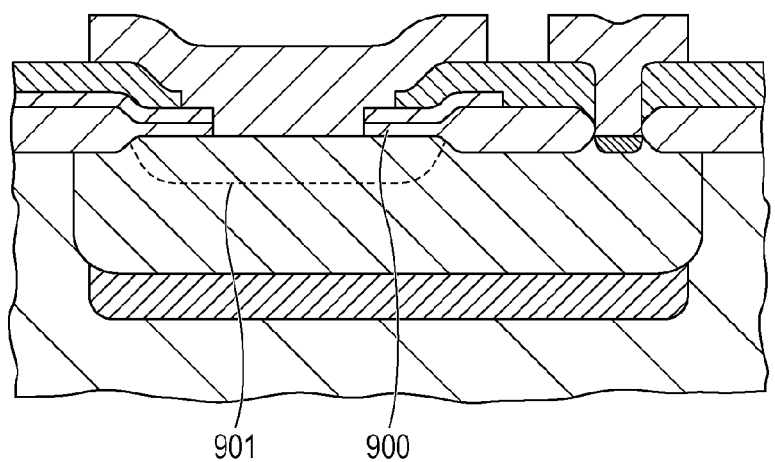
FIG. 9 illustrates a diode of a background technology.

A detecting device 500 according to a second example will be described with reference to FIG. 8. FIG. 8 illustrates a variation example of the first example. In this example, the detecting device may be used for an application for amplifying a detection signal. A detection signal may be amplified by a MOSFET 830 integrally formed on the Si substrate 101.

The MOSFET 830 in this example includes a gate electrode 831, a gate insulating layer 832, a source electrode 833, a drain electrode 834, and an ion implanted region 835. In order to amplify a detection signal, the Schottky electrode 106 is connected to a wire 836 such that a detection signal may be input to the gate electrode 831 of the MOSFET 830. A resistance of the Schottky barrier diode or a resistor not illustrated inputs converted rectified voltage to the MOSFET 830. In this case, either well-known source connection of the ohmic electrode 107 to the source electrode 833 or well-known source follower by connecting the ohmic electrode 107 to the drain electrode 834 may be selected in accordance with the purpose. A detection signal amplified from the MOSFET is output from an electrode that is connected to neither Schottky electrode 106 nor ohmic electrode 107. In this manner, a detecting device may be configured which includes a Schottky barrier diode and a transistor configured to output a detection signal, wherein the Schottky barrier diode and the transistor are arranged on one substrate.

A detecting device according to this example may be produced by performing local oxidation on the LOCOS layer 105 by the steps (1) and (2) according to the first example and then forming a part corresponding to the island 823 by the same steps disclosed in the first example. After that, a standard CMOS process may be used to produce the MOSFET 830 on the Si substrate 101. Then, an electrode structure may be integrally formed by the steps (3) to (8) according to the first example. A configuration having a detecting device and a MOSFET as an amplifier for the detecting device on a same substrate may be produced by a standard CMOS process at low costs. The shorter the wire 836 is, the less noise is mixed into a detection signal. Therefore, integrating them on one substrate is also effective for a lower NF.

Also in this case, connecting a detecting device of this example to matrix wiring to use a MOSFET as a switching element for an active matrix results in the following apparatus. That is, there may be provided an image forming apparatus including an image forming unit which forms an image of an electric-field distribution on the basis of electric fields of electromagnetic waves detected by a plurality of highly dense detecting devices.

A Schottky barrier diode of the present invention may be used as a part of a detecting device, but it may be used as a part of an oscillating element on general principles. An oscillating element and/or a detecting device including a Schottky barrier diode of the present invention may be applied industrially to a test apparatus which examines quality of a sample of medical supplies, for example.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-144320 filed Jun. 27, 2012, which is hereby incorporated by reference herein in its entirety.

What is claimed is:

1. A Schottky barrier diode comprising:
    a first semiconductor layer;
    a LOCOS layer arranged in contact with the first semiconductor layer;

a first electrode arranged in contact with the first semiconductor layer on an upper surface of a mesa structure and forming a Schottky junction on a contact surface between the first semiconductor layer and the first electrode;

a second semiconductor layer electrically connected to the first semiconductor layer and having a higher carrier concentration than that of the first semiconductor layer; and a second electrode forming an ohmic contact with the second semiconductor layer, wherein the LOCOS layer is in contact with a side surface of the mesa structure and the contact surface on which the Schottky junction is formed, and wherein the contact surface on which the Schottky junction is formed and the side surface of the mesa structure layer are in contact.

2. The Schottky barrier diode according to claim 1, wherein the second semiconductor layer and the first semiconductor layer are integrally formed on a substrate.

3. The Schottky barrier diode according to claim 1, wherein the first electrode or the second electrode is also formed on at least a part of the LOCOS layer.

4. The Schottky barrier diode according to claim 1, wherein the contact surface on which the Schottky junction is formed is surrounded by the LOCOS layer.

5. The Schottky barrier diode according to claim 1, wherein the LOCOS layer is formed to insulate the first electrode from the second electrode.

6. The Schottky barrier diode according to claim 1, wherein the first semiconductor layer includes an epitaxially grown semiconductor layer.

7. The Schottky barrier diode according to claim 1, wherein the Schottky barrier diode has an island shape on the semiconductor substrate.

8. A detecting device comprising:
the Schottky barrier diode according to claim 1; and
an antenna, comprising an electric field component of a detected electromagnetic wave between the first electrode and the second electrode,
wherein the first electrode and the second electrode are configured as output ports of the antenna.

9. A detecting device comprising:
the Schottky barrier diode according to claim 1; and
a transistor configured to output a detection signal,
wherein the detecting device and the transistor are arranged on a same substrate.

10. The Schottky barrier diode according to claim 1, wherein the first electrode is a layer containing metal.

11. The Schottky barrier diode according to claim 1, wherein the LOCOS layer is formed to a depth sufficient to make contact with the second semiconductor layer.

12. The Schottky barrier diode according to claim 1, wherein the LOCOS layer is a layer formed by a local oxidation of silicon method.

13. The Schottky barrier diode according to claim 1, wherein the second electrode is electrically in contact with the LOCOS layer.

14. The Schottky barrier diode according to claim 1, wherein the first electrode covers the first semiconductor layer and a part of the LOCOS layer.

15. A Schottky barrier diode manufacturing method, comprising:
forming a pattern layer on a first semiconductor layer;
forming a LOCOS layer around the pattern layer and a mesa structure of the first semiconductor layer under the pattern layer by thermal oxidation;

removing the pattern layer to expose the first semiconductor layer of an upper side of the mesa structure;

forming a first electrode to form a Schottky junction with the exposed first semiconductor layer, the first electrode being in contact with the LOCOS layer and covering a part of the LOCOS layer and the exposed first semiconductor layer; and forming a second electrode connected to the first semiconductor layer, the second electrode forming an ohmic contact with a part of a second semiconductor layer having a high carrier concentration than the first semiconductor layer, wherein the first electrode is formed so that a contact surface forming the Schottky junction between the exposed first semiconductor layer and the first electrode is in contact with the LOCOS layer and a side surface of the mesa structure.

16. The Schottky barrier diode manufacturing method according to claim 15, wherein the pattern layer contains $Si_3N_4$.

17. A Schottky barrier diode manufacturing method, comprising:
forming a pattern layer containing $Si_3N_4$ on a first semiconductor layer;
forming a LOCOS layer around the pattern layer by thermal oxidation and a mesa structure of the first semiconductor layer under the pattern layer;
removing the pattern layer to expose the first semiconductor layer of the upper side of the mesa structure;
forming a second semiconductor layer by selective epitaxial growth on the exposed the first semiconductor layer;
forming a first electrode to form a Schottky junction with a surface of the second semiconductor layer, the first electrode being in contact with the LOCOS layer and covering a part of the LOCOS layer; and
forming a second electrode in ohmic contact with a part of the first semiconductor layer,
wherein the first electrode is formed so that a contact surface forming the Schottky junction between the surface of the second semiconductor layer and the first electrode is in contact with the LOCOS layer and a side surface of the second semiconductor layer.

18. The Schottky barrier diode manufacturing method according to claim 17, wherein the pattern layer contains $Si_3N_4$.

19. A diode comprising:
a first semiconductor layer having a mesa structure;
a first electrode arranged in contact with the first semiconductor layer on an upper surface of the mesa structure and forming a Schottky junction on a contact surface between the first semiconductor layer and the first electrode;
a second semiconductor layer electrically connected to the first semiconductor layer and having a higher carrier concentration than that of the first semiconductor layer;
a second electrode forming an ohmic contact with the second semiconductor layer; and
an insulating layer being in contact with a contact surface forming the Schottky junction between the first semiconductor layer and the first electrode, and a side surface of the mesa structure,
wherein the contact surface is in contact with the side surface of the mesa structure.

20. The diode according to claim 19, wherein the insulation layer is an oxidized portion of the first semiconductor layer.

21. A diode comprising:
a first semiconductor layer;
a second semiconductor layer including the first semiconductor layer and having a mesa structure in which the first semiconductor layer is arranged on an upper surface of the mesa structure, the second semiconductor layer being electrically connected to the first semiconductor layer and having a higher carrier concentration than that of the first semiconductor layer;
a first electrode arranged in contact with an upper surface of the first semiconductor layer and forming a Schottky junction on the upper surface;
a second electrode forming an ohmic contact with the second semiconductor layer; and
an insulating layer being in contact with a contact surface forming the Schottky junction between the first semiconductor layer and the first electrode and a side surface of the mesa structure,
wherein the contact surface is in contact with the side surface of the mesa structure.

22. The diode according to claim 21, wherein the insulating layer is an oxidized portion of the first semiconductor layer.

* * * * *